US009520199B2

(12) United States Patent
Chang

(10) Patent No.: US 9,520,199 B2
(45) Date of Patent: Dec. 13, 2016

(54) MEMORY DEVICE AND READING METHOD THEREOF

(71) Applicant: MACRONIX INTERNATIONAL CO., LTD., Hsinchu (TW)

(72) Inventor: Kuo-Pin Chang, Miaoli County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/692,927

(22) Filed: Apr. 22, 2015

(65) Prior Publication Data

US 2016/0314849 A1    Oct. 27, 2016

(51) Int. Cl.
G11C 16/04    (2006.01)
G11C 16/28    (2006.01)
G11C 16/34    (2006.01)

(52) U.S. Cl.
CPC ........... *G11C 16/28* (2013.01); *G11C 16/0433* (2013.01); *G11C 16/0483* (2013.01); *G11C 16/3427* (2013.01)

(58) Field of Classification Search
CPC ...................................... G11C 16/04
USPC ...................................... 365/185.05
See application file for complete search history.

(56) References Cited

U.S. PATENT DOCUMENTS

| 8,574,992 B2* | 11/2013 | Chen ................. H01L 27/11206 257/314 |
| 2013/0075802 A1* | 3/2013 | Chen ................. H01L 27/11206 257/314 |
| 2014/0198570 A1 | 7/2014 | Hsieh et al. |
| 2014/0254284 A1 | 9/2014 | Hung et al. |

OTHER PUBLICATIONS

TIPO Office Action dated Jul. 22, 2016 in Taiwan application (No. 104111546).

* cited by examiner

*Primary Examiner* — Harry W Byrne
(74) *Attorney, Agent, or Firm* — McClure, Qualey & Rodack, LLP

(57) ABSTRACT

A memory device includes: a plurality of conductive stacked structures including at least a string select line, a plurality of word lines and at least a ground select line; a plurality of memory cells formed in the conductive stacked structures; a plurality of bit lines, formed on the conductive stacked structures; and at least an odd common source line and at least an even common source line, formed on the conductive stacked structures. The odd common source line is coupled to a plurality of odd bit lines of the bit lines. The even common source line is coupled to a plurality of even bit lines of the bit lines.

4 Claims, 8 Drawing Sheets

MEMORY DEVICE AND READING METHOD THEREOF

TECHNICAL FIELD

The disclosure relates in general to a memory device and a reading method thereof.

BACKGROUND

During memory reading, a read disturbance error may occur. The read disturbance error refers to that, if the gate voltage of the memory cell transistor is too high, the electrons in the channel or the electrons/electronic holes in the source/drain are drawn to the floating gate to change the storage data (from "1" to "0"). For example, during reading on a selected page, if the gate voltage applied to the gate of the transistors of the unread page is too high, the read disturbance error may occur in the unread page. If the number of the reading operations is thousands or millions, the read disturbance error may be more serious.

Therefore, the application discloses a memory device and a reading method thereof, which may reduce the read disturbance error.

SUMMARY

The disclosure is directed to a memory device including an even common source line (which is coupled to a plurality of even bit lines) and an odd common source line (which is coupled to a plurality of odd bit lines). The even common source line and the odd common source line are electrically isolated.

The disclosure is directed to a memory device including an even ground selection line (which is coupled to a plurality of even bit lines) and an odd ground selection line (which is coupled to a plurality of odd bit lines). The even ground selection line and the odd ground selection line are electrically isolated.

The disclosure is directed to a reading method for a memory device. In reading, the gate-source voltages of the unread/unselected memory cells are reduced via a force-biasing or self-boosting, to reduce the read disturbance error.

According to one embodiment, a memory device is provided. The memory device includes: a plurality of conductive stack structures, including at least a string select line, a plurality of word lines and at least a ground select line; a plurality of memory cells, formed in the conductive stack structures; a plurality of bit lines, formed on the conductive stack structures; and at least an odd common source line and at least an even common source line, formed on the conductive stack structures, wherein the odd common source line is coupled to a plurality of odd bit lines of the bit lines, and the even common source line is coupled to a plurality of even bit lines of the bit lines.

According to another embodiment, a memory device is provided. The memory device includes: a plurality of conductive stack structures, including at least a string select line, a plurality of word lines, at least an odd ground select line and at least an even ground select line; a plurality of memory cells, formed in the conductive stack structures; a plurality of bit lines, formed on the conductive stack structures; and at least a common source line, formed on the conductive stack structures, wherein the odd ground select line is coupled to a plurality of odd bit lines of the bit lines, and the even ground select line is coupled to a plurality of even bit lines of the bit lines.

According to an alternative embodiment, a reading method for a memory device is provided. The memory device includes a plurality of first bit lines, a plurality of second bit lines, at least a first common source line coupled to the first bit lines, and at least a second common source line coupled to the second bit lines. In reading the first bit line of a selected page, a reference voltage is applied to the first common source line of the selected page; a bit line voltage is applied to the first bit lines of the selected page; and any of the bit line voltage and another reference voltage is applied to the second bit lines and the second common source line of the selected page, both the bit line voltage and the another reference voltage higher than the reference voltage. A first cross voltage of a plurality of memory cells on the first bit lines of the selected page is higher than a second cross voltage of a plurality of memory cells on the second bit lines of the selected page. As for an unselected page, the reference voltage is applied to the first common source line of the unselected page; the bit line voltage is applied to the first bit lines of the unselected page; and the one of the bit line voltage and another reference voltage is applied to the second bit lines and the second common source line of the unselected page. Accordingly, the first cross voltage of a plurality of memory cells on the first bit lines of the unselected page is higher than the second cross voltage of a plurality of memory cells on the second bit lines of the unselected page.

Figure 1:
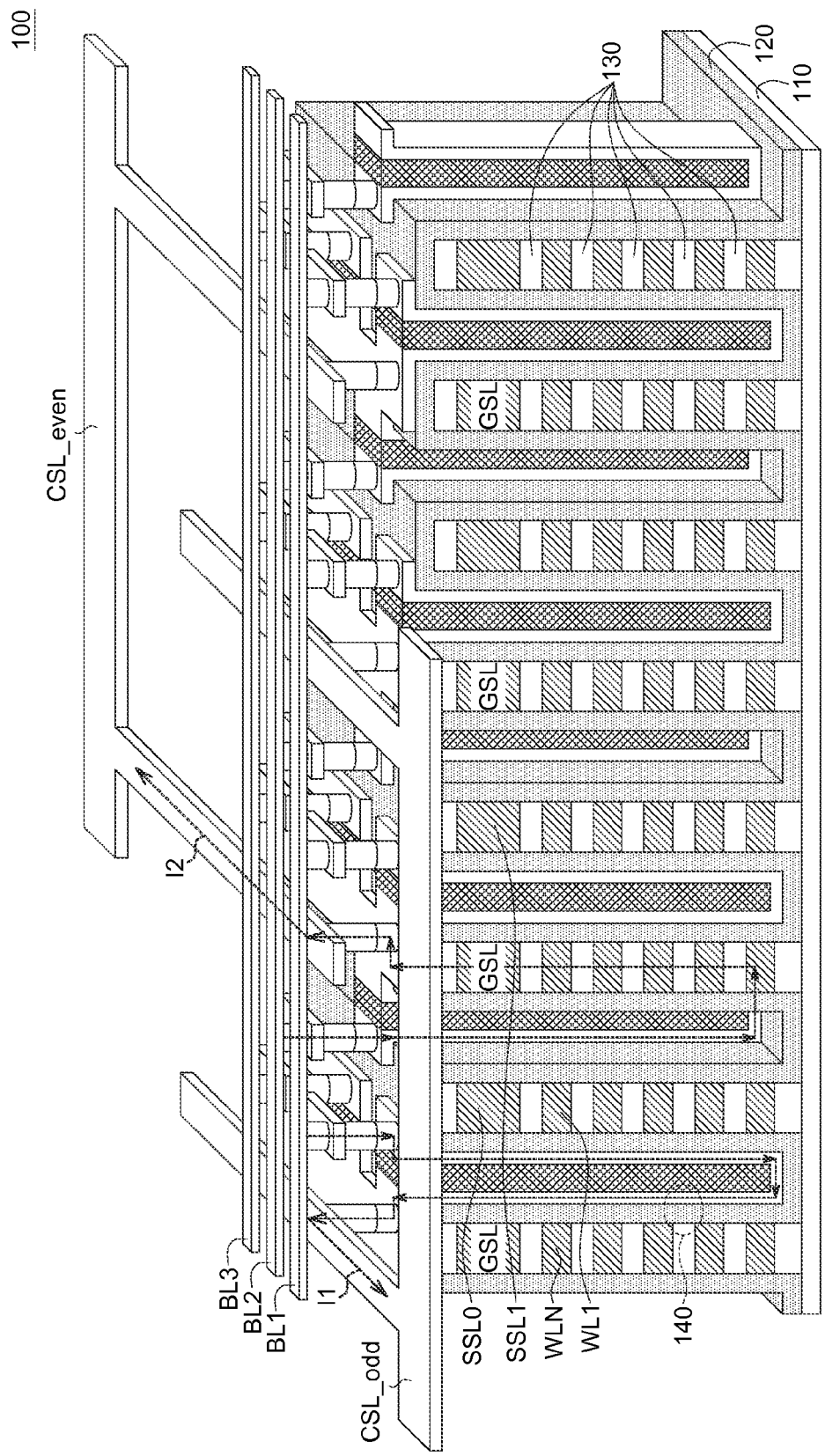
FIG. 1 shows a partial cross-view diagram of a memory device according to a first embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a partial cross-view diagram of a memory device 100 according to a first embodiment of the application. As shown in FIG. 1, the memory device 100 according to the first embodiment of the application includes bit lines BL1-BL3, string select line SSL0-SSL3, a ground select line GSL, word lines WL1-WLN (N being a natural number), an odd common source line CSL_odd, an even common source line CSL_even, a substrate 110, a dielectric layer 120, a plurality of insulating layers 130 and a plurality of memory cells 140.

The insulating layers 130 are disposed between the string select line SSL0 and the word line WL1, and/or between two adjacent word lines, and/or between the word line WLN and the ground select line GSL.

The insulating layers 130 for example include interlayer dielectric material, for example, silicon dioxide, or other material having dielectric constant.

The above structure is formed on the dielectric layer 120, and the dielectric layer 120 is formed on the substrate 110.

Besides, the memory cells 140, which are for data storage, may include a multilayer tunneling structure, a dielectric charge trapping layer and a blocking layer.

In the memory device 100 of FIG. 1, the common source line includes the odd common source line CSL_odd and the even common source line CSL_even. The odd common source line CSL_odd is coupled to the odd bit lines (for example, BL1, BL3, . . . ); and the even common source line CSL_even is coupled to the even bit lines (for example, BL2, BL4, . . . ).

In the memory device 100 of FIG. 1, the string selection line, the word lines and the ground select line are stacked as a plurality of conductive stack structures. For example, the string selection line and a first word line group (the word lines WL1, WL2, . . . ) of the word lines are stacked as a first conductive stack structure; and the ground select line and a second word line group (the word line WLN, . . . ) of the word lines are stacked as a second conductive stack structure. The memory cells 140 of the memory device 100 are formed in the conductive stack structures. For example, the memory cells 140 are formed on sidewalls of the conductive stack structures. The bit lines are formed on the conductive stack structures.

The odd common source line CSL_odd and the even common source line CSL_even, which are electrically isolated, are formed on the conductive stack structures.

No matter which page is selected, a string current from the odd bit line flows through a channel (that is, through a corresponding conductive stack structure) into the odd common source line CSL_odd, as shown by the current path 11. Similarly, a string current from the even bit line flows through a channel (that is, through a corresponding conductive stack structure) into the even common source line CSL_even, as shown by the current path 12.

Figure 2B:
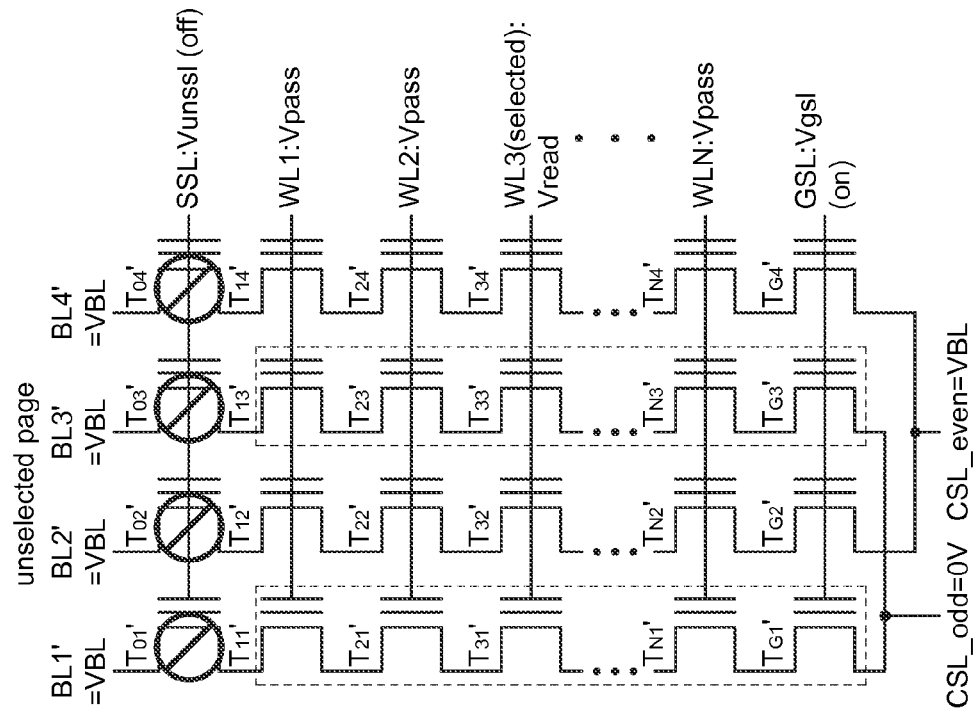
FIG. 2A and FIG. 2B show a reading method (force-biasing) according to the first embodiment of the application.
Figure 2A:
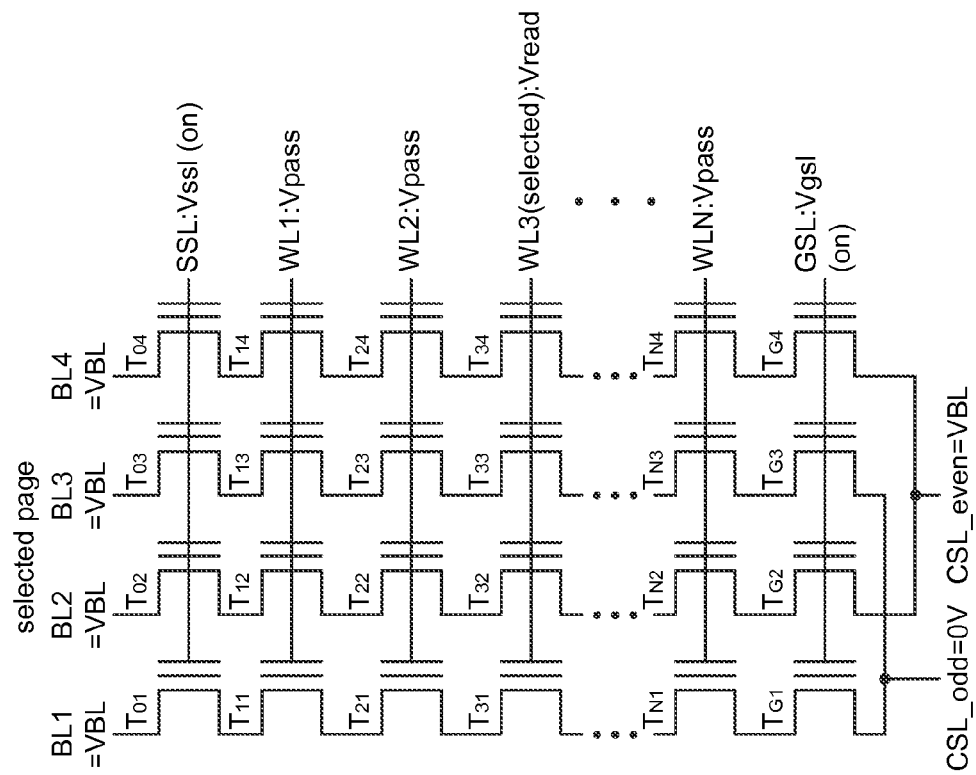

Now refer to FIG. 2A and FIG. 2B, which show a reading method (force-biasing) according to the first embodiment of the application. FIG. 2A shows operations of the force-biasing reading method performed on a selected page according to the first embodiment of the application. FIG. 2B shows operations of the force-biasing reading method performed on an unselected page according to the first embodiment of the application.

In FIG. 2A, a page includes at least bit lines BL1-BL4 each coupled to a plurality of transistors T01-TG1, T02-TG2, T03-TG3, and T04-TG4. Of course, the application is not limited by the number of the bit lines or the transistors shown in the drawings.

Gates of the transistors T01-T04 are all coupled to the string select line SSL and thus the transistors T01-T04 may be referred as string select switches. Gates of the transistors T11-T14 are all coupled to the first word line WL1; gates of the transistors T21-T24 are all coupled to the second word line WL2; gates of the transistors T31-T34 are all coupled to the third word line WL3; . . . and gates of the transistors TN1-TN4 are all coupled to the N-th word line WLN. Gates of the transistors TG1-TG4 are all coupled to the ground select line GSL, and thus the transistors TG1-TG4 may be referred as ground select switches.

Coupling in FIG. 2B is similar. Another page at least includes bit lines BL1'-BL4' each coupled to the transistors T01'-TG1', T02'-TG2', T03'-TG3' and T04'-TG4', respectively. Gates of the transistors T01'-T04' (the string select switches) are all coupled to the string select line SSL. Gates of the transistors T11'-T14' are all coupled to the first word line WL1; gates of the transistors T21'-T24' are all coupled to the second word line WL2; gates of the transistors T31'-T34' are all coupled to the third word line WL3; . . . and gates of the transistors TN1'-TN4' are all coupled to the N-th word line WLN. Gates of the transistors TG1'-TG4' (the ground select switches) are all coupled to the ground select line GSL.

In FIG. 2A and FIG. 2B, each of the transistors T11-TN1, T12-TN2, T13-TN3, T14-TN4, T11'-TN1', T12'-TN2', T13'-TN3' and T14'-TN4' forms a memory cell. FIG. 3A, FIG. 3B, FIG. 5A, FIG. 5B, FIG. 6A and FIG. 6B are similar in this.

As shown in FIG. 2A, as for the selected page, all bit lines BL1-BL4 are applied by a bit line voltage VBL, wherein the bit line voltage VBL is higher than 0V, for example, 0.6V-1V. The string select line SSL is applied by a voltage Vssl to turn on the transistors T01-T04. Reading the transistors on the word line WL3 is taken as an example but the application is not limited by. The word line WL3 is applied by a read voltage Vread to turn on the transistors T31-T34 coupled to the word line WL3. Other word lines are applied by a pass voltage Vpass to turn on the coupled transistors. The ground select line GSL is applied by a voltage Vgsl to turn on the transistors TG1-TG4 coupled to the ground select line GSL. That is, in this reading method, the channels of the selected page are turned on, wherein the channel refers to the transistors coupled to the same bit line.

In the first reading method (force-biasing) of the first embodiment of the application, if the odd bit lines of the selected page are read, then the odd common source line CSL_odd is applied by a ground voltage (0V) and the even common source line CSL_even is applied by the bit line voltage VBL. Similarly, if the even bit lines of the selected page are read, then the odd common source line CSL_odd is applied by the bit line voltage VBL and the even common source line CSL_even is applied by the ground voltage (0V).

Via the voltage applying, the gate-source voltage of the unread/unselected transistors may be reduced to reduce the read disturbance error. For example, as shown in FIG. 2A, if the odd bit lines of the selected page are read, the gate-source voltages of the transistors of the even bit lines (for example, the transistor T32 on the bit line BL2) are Vpass-VBL. On the contrary, in the current solution, if the odd bit lines of the selected page are read, the gate-source voltages of the transistors of the even bit lines will be Vpass-0V. Therefore, in the first embodiment of the application, the gate-source voltages of the unread transistors in the selected pages are reduced and thus the read disturbance error is reduced.

Similarly, in the unselected page, the string select line SSL is applied by a voltage Vunssl to turn off the transistors T01'-T04'. The voltages applied to the bit lines BL1'-BL4', the word lines WL1-WLN and the ground select line GSL of the unselected page are the same or similar to those applied to the bit lines BL1-BL4, the word lines WL1-WLN and the ground select line GSL of the select page, and thus the details are omitted here.

Similarly, in the unselected page, the gate-source voltages of the transistors on the even bit lines are reduced as Vpass-VBL (if the odd bit lines of the select page are read), and thus the read disturbance error is also reduced. The gate-source voltages of the transistors on the odd bit lines of the unselected pages are Vpass-0V (if the odd bit lines of the select page are read).

Figures 3A, 3B:
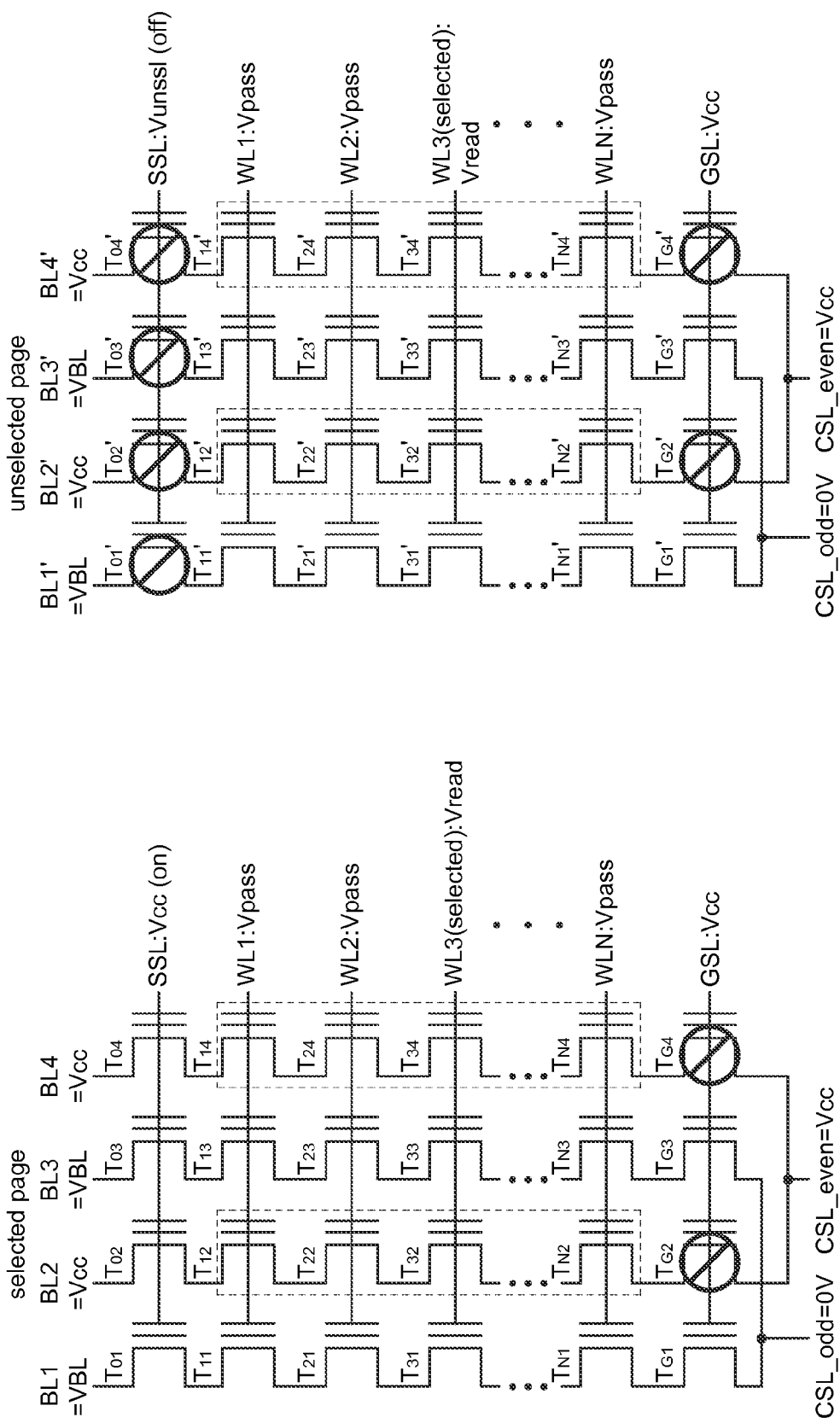
FIG. 3A and FIG. 3B show another reading method (self-boosting) according to the first embodiment of the application.

Now refer to FIG. 3A and FIG. 3B which show another reading method (self-boosting) according to the first embodiment of the application. FIG. 3A shows operations of the self-boosting reading method performed on a selected page according to the first embodiment of the application. FIG. 3B shows operations of the self-boosting reading method performed on an unselected page according to the first embodiment of the application.

As shown in FIG. 3A, reading the odd bit lines of the select page is taken as an example. The odd bit lines BL1, BL3, . . . are applied by the bit line voltage VBL while the even bit lines BL2, BL4, . . . are applied by a reference voltage Vcc. The string select line SSL is applied by the voltage Vcc (which is higher than the voltage Vssl) to turn on the transistors T01-T04. Reading the transistors on the word line WL3 is taken as an example. The word line WL3 is applied by the read voltage Vread to turn on the transistors T31-T34 coupled to the word line WL3. Other word lines are applied by the pass voltage Vpass to turn on the coupled transistors. The ground select line GSL is applied by the voltage Vcc (which is higher than the voltage Vgsl) to turn on the transistors TG1-TG4 coupled to the ground select line GSL.

In the second reading method (self-boosting) of the first embodiment of the application, if the odd bit lines of the selected page are read, the odd common source line CSL_odd is applied by 0V and the even common source line CSL_even is applied by the voltage Vcc. Thus, as shown in FIG. 3A, the transistors TG1 and TG3 are turned on while the transistors TG2 and TG4 are turned off. Similarly, if the even bit lines of the selected page are read, the odd common source line CSL_odd is applied by the voltage Vcc and the even common source line CSL_even is applied by 0V.

During reading, on the unselected bit lines (for example, the bit line BL2) of the selected page, the ground select switch (for example, the transistor TG2) on one terminal of the channel is turned off while the string select switch (for example, the transistor T02) on the other terminal of the channel is turned on.

Then, the word lines WL1-WLN are applied by the pass voltage Vpass but the read word line WL3 is applied by the read voltage Vread. Via the coupling effect, the source voltage of the transistor TN2 is pulled up to a voltage Vch. The voltage Vch is related to the voltage Vpass and a coupling coefficient C. For example, if the voltage Vpass is 8V and the coupling coefficient C is 0.8, then the voltage Vch will be Vpass*C=8V*0.8=6.4V. Thus, the gate-source voltages of the transistors (for example the transistor TN2) on the unread bit lines of the selected page are Vpass-Vch. In the current solution, the gate-source voltages of the transistors on the unread bit lines of the selected page are Vpass-0V. The second reading method in the first embodiment of the application may effectively reduce the read disturbance error.

Thus, in the second reading method, in the selected page, the transistors (for example, T12-TN2, T14-TN4) on the unread bit lines are in a floating state (except that the transistors on the two terminals of the channels are not in floating) and the gate-source voltages of these floating transistors are reduced as Vpass-Vch by the voltage coupling effect.

Similarly, as shown in the unselected page of FIG. 3B, the string select line SSL is applied by the voltage Vunssl to turn on the transistors T01'-T04'. The voltages applied to the bit lines BL1'-BL4' and the word lines WL1-WLN are the same or similar to those applied the bit lines BL1-BL4 and the word lines WL1-WLN of the selected page. In the unselected page, the ground select line GSL is also applied by the voltage Vcc.

Similarly, in reading the odd bit lines of the selected page, the transistors (for example, T12'-TN2') of the even bit lines of the unselected page are also floated and thus effected by the self-boosting operation. For example, the gate-source voltage of the transistor T32' on the even bit line BL2 is reduced as Vpass-Vch. Thus, the read disturbance error is effectively reduced.

Figure 4:
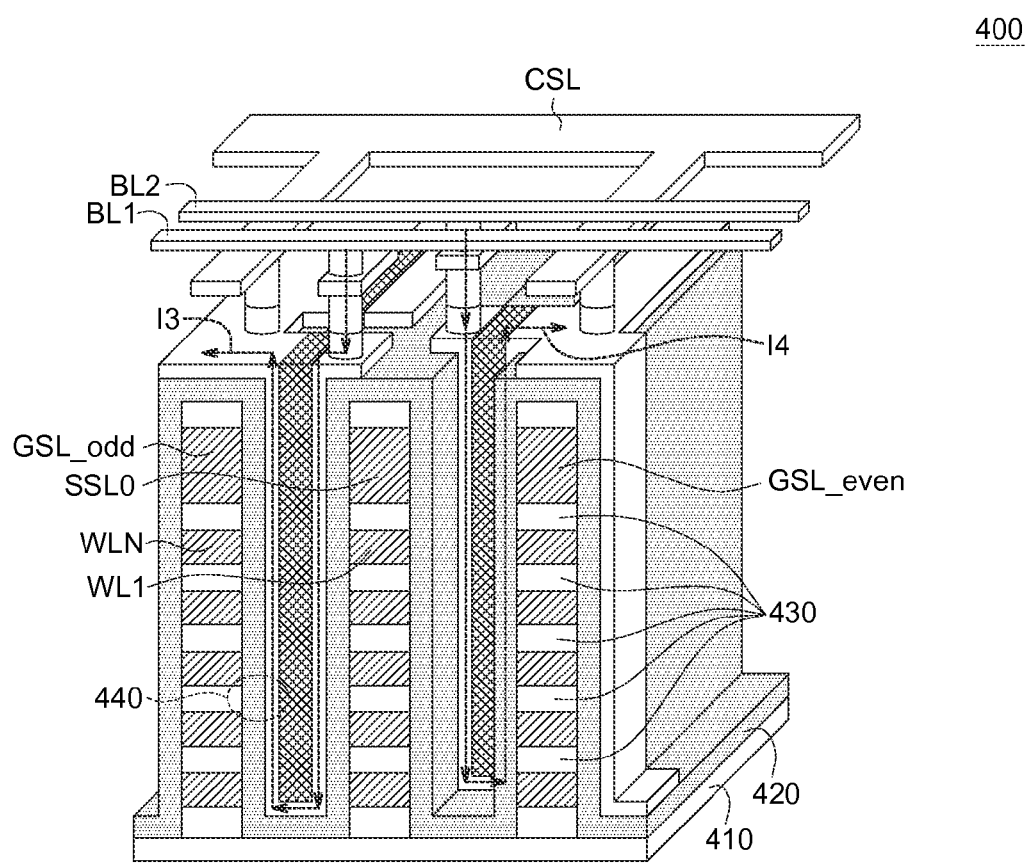
FIG. 4 shows a partial cross-view diagram of a memory device according to a second embodiment of the application.

Now refer to FIG. 4 which shows a partial cross-view diagram of a memory device according to a second embodiment of the application. As shown in FIG. 4, the memory device 400 includes the bit lines (BL1, BL2, . . . ), the string select lines (SSL0, . . . ), the odd ground select line GSL_odd, the even ground select line GSL_even, the word lines WL1-WLN, the common source line CSL, the substrate 410, the dielectric layer 420, a plurality of insulating layers 430 and a plurality of memory cells 440.

Basically, the substrate 410, the dielectric layer 420, the insulating layers 430 and the memory cells 440 are the same or similar to the substrate 110, the dielectric layer 120, the insulating layers 130 and the memory cells 140 of FIG. 1 and thus the details are omitted here.

Different from the memory device 100 in FIG. 1, in the memory device 400 of FIG. 4, the common source line CSL is coupled to all the bit lines. The odd ground select line GSL_odd is coupled to all the odd bit lines (BL1, . . . ), and the even ground select line GSL_even is coupled to all the even bit lines (BL2, . . . ). No matter which page is selected, the string current from the odd bit line flows through the channel into the common source line CSL, as shown by the current path 13. Similarly, the string current from the even bit line flows through the channel into the common source line CSL, as shown by the current path 14.

Figure 5A:
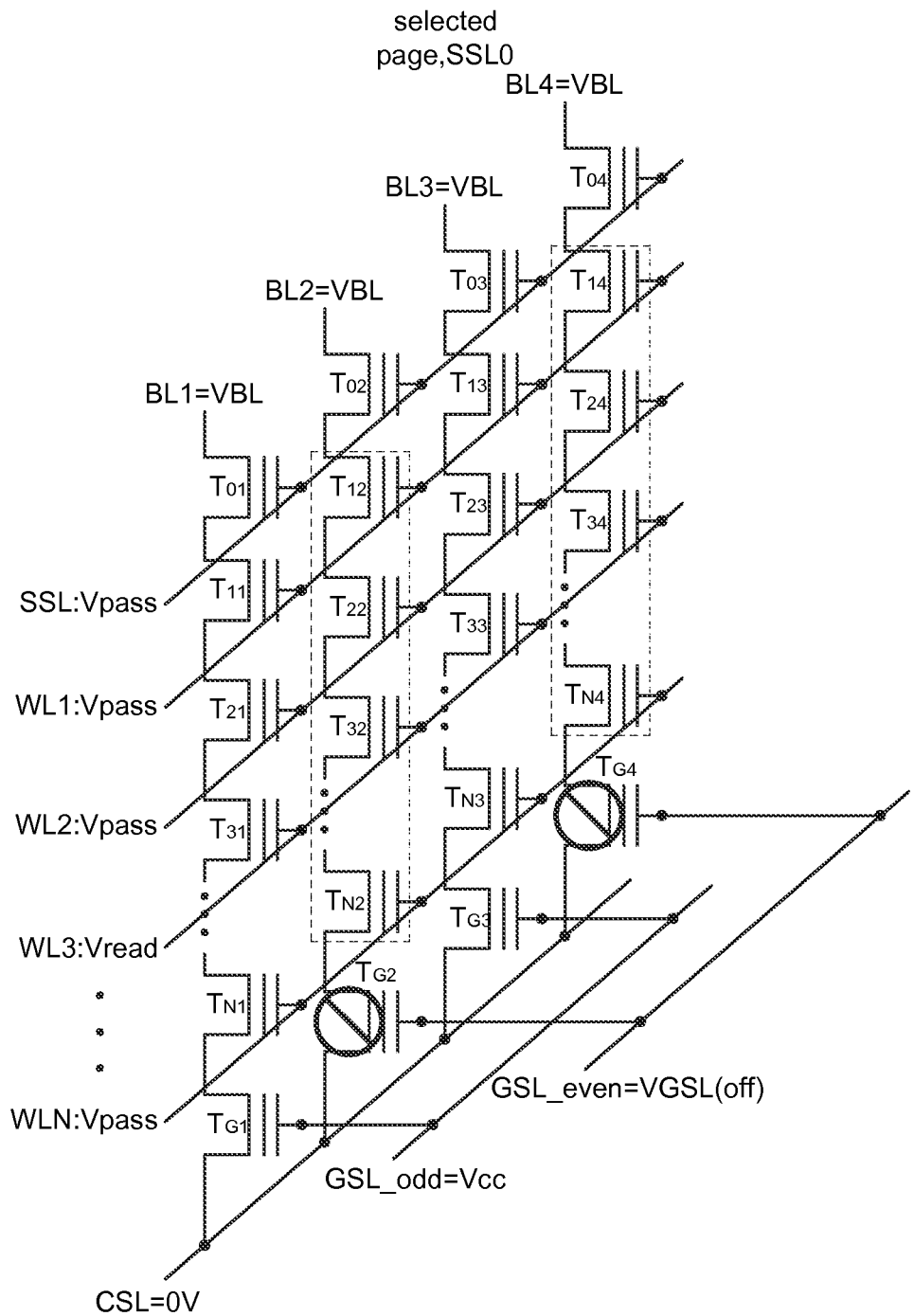
FIG. 5A and FIG. 5B show a reading method (force-biasing) according to the second embodiment of the application.
Figure 5B:
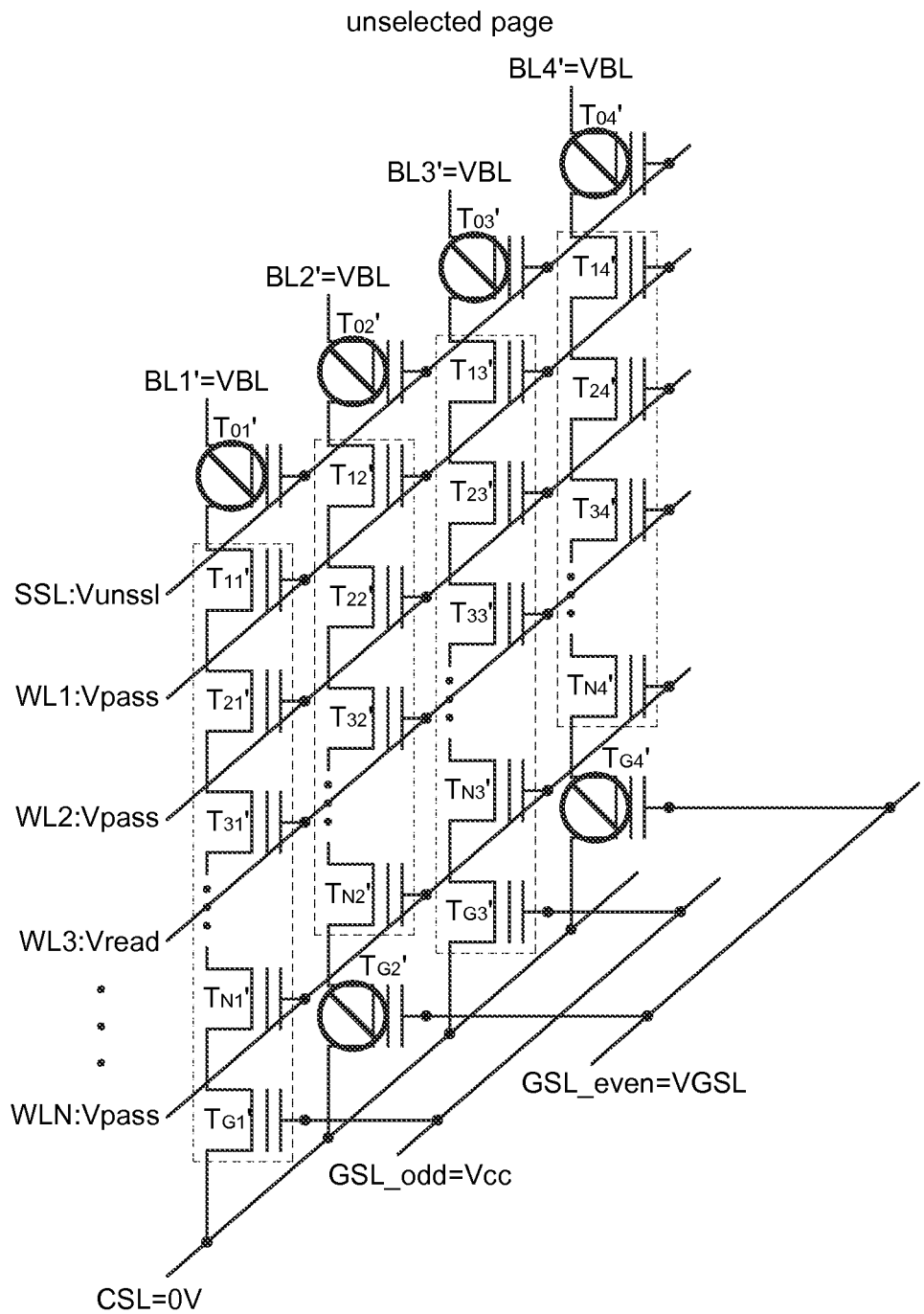

Now refer to FIG. 5A and FIG. 5B which show the reading method (force-biasing) according to the second embodiment of the application. FIG. 5A shows operations of the force-biasing reading method performed on a selected page according to the second embodiment of the application. FIG. 5B shows operations of the force-biasing reading method performed on an unselected page according to the second embodiment of the application.

In FIGS. 5A and 5B, the ground select line is divided into the odd ground select line GSL_odd and the even ground select line GSL_even. The odd ground select line GSL_odd is coupled to all the odd bit lines and the even ground select line GSL_even is coupled to all the even bit lines.

As shown in FIG. 5A, in the selected page, all bit lines BL1-BL4 are applied by the bit line voltage VBL. The string select line SSL is applied by the voltage Vssl to turn on the transistors T01-T04. Reading the transistors on the word line WL3 is taken as an example but the application is not limited by. The word line WL3 is applied by a read voltage Vread to turn on the transistors T31-T34 coupled to the word line WL3. Other word lines are applied by the pass voltage Vpass to turn on the coupled transistors. The odd ground select line GSL_odd, coupled to the read odd bit lines, is applied by the voltage Vpass or Vcc to turn on the coupled transistors TG1, TG3, . . . . The even ground select line GSL_even, coupled to the unread even bit lines, is applied by the voltage VGSL to turn off the coupled transistors TG2, TG4, . . . . The common source line CSL is applied by 0V.

In the first reading method (force-biasing) of the second embodiment of the application, via the voltage applying, the gate-source voltages of the unread/unselected transistors may be reduced to eliminate the read disturbance error. For example, as shown in FIG. 5A, if the odd bit lines of the selected page are read, the gate-source voltages of the transistors of the even bit lines (for example, the transistor T32 on the bit line BL2) are Vpass-VBL because of self-boosting. That is because, except the transistors TG2, TG4, . . . , the transistors T12-TN2, T14-TN4, . . . are floated and thus the source voltages of the floated transistors T12-TN2, T14-TN4, . . . are self-boosted to VBL.

On the contrary, in the current solution, if the odd bit lines of the selected page are read, the gate-source voltage of the transistors of the even bit lines (for example, the transistor T32 on the bit line BL2) will be Vpass-0V. Therefore, in the second embodiment of the application, the gate-source voltages of the unread transistors in the selected pages are reduced and thus the read disturbance error is reduced.

Further, in the first reading method of the second embodiment, because all the bit lines are applied by the same voltage, the coupling capacitance between the bit lines are largely reduced to improve the pre-charge efficiency.

Similarly, in the unselected page, as shown in FIG. 5B, the string select line SSL is applied by the voltage Vunssl to turn off the transistors T01'-T04'. The voltages applied to the bit lines BL1'-BL4' and the word lines WL1-WLN of the unselected page are the same or similar to those applied to the bit lines BL1-BL4 and the word lines WL1-WLN of the selected page, and thus the details are omitted here. The odd ground select line GSL_odd coupled to the read odd bit lines is applied by the voltage Vpass or Vcc to turn on the coupled transistors TG1, TG3, . . . . The even ground select line GSL_even coupled to the unread odd bit lines is applied by the voltage VGSL to turn off the coupled transistors TG2, TG4, . . . . The common source line CSL is applied by 0V.

Similarly, in the unselected page of FIG. 5B, the turned-on transistors on the even bit lines of the unselected page are self-boosted, as described above. The gate-source voltages of the turned-on transistors on the even bit lines of the unselected page are reduced as Vpass-Vch, and thus the read disturbance error is also reduced. The gate-source voltages of the transistors on the odd bit lines of the unselected pages are Vpass-0V.

That is, in the force-biasing reading method of FIG. 5A, the transistors on the unread bit lines are also self-boosted.

Figure 6A:
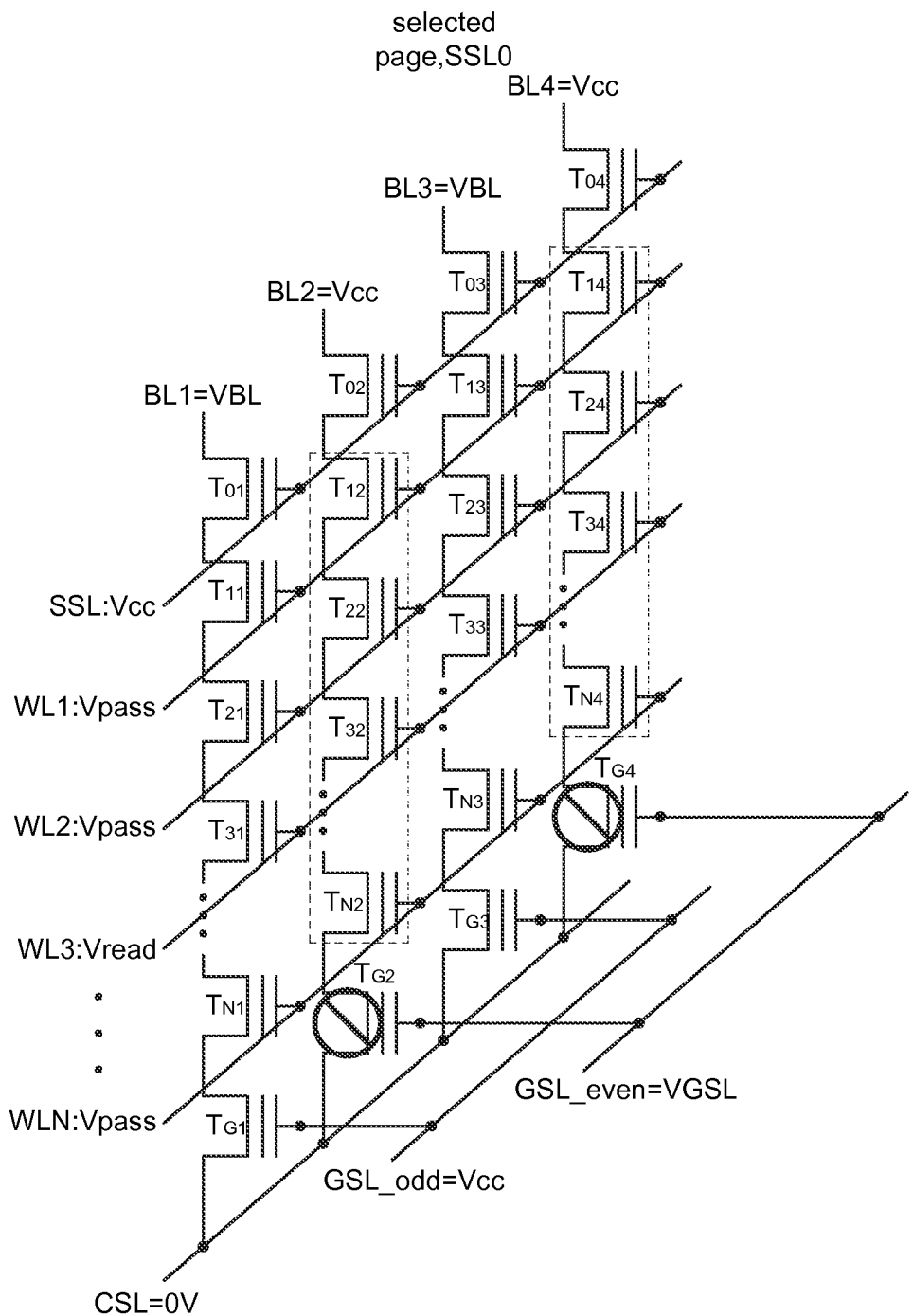
FIG. 6A and FIG. 6B show another reading method (self-boosting) according to the second embodiment of the application.
Figure 6B:
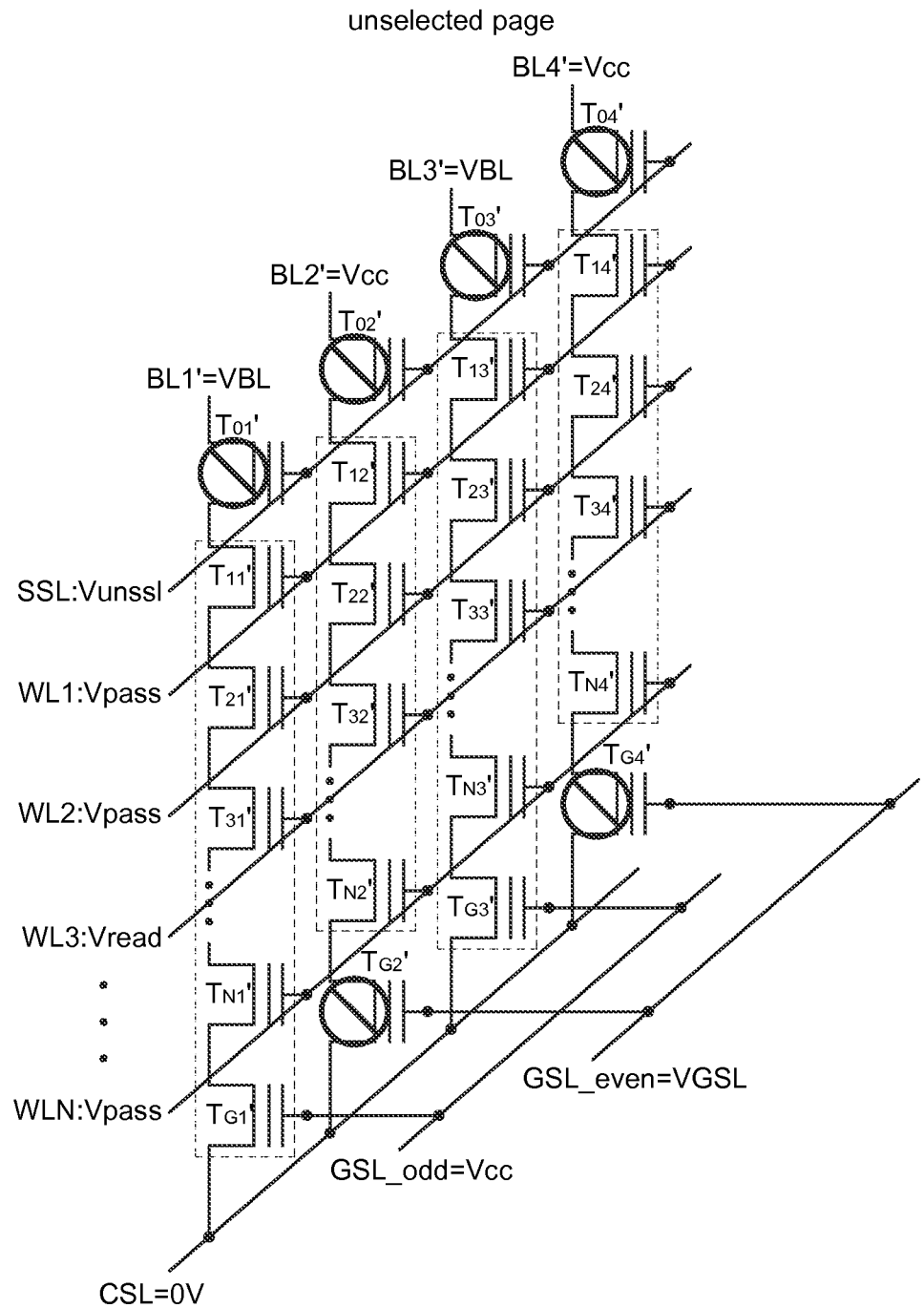

Now refer to FIG. 6A and FIG. 6B which show the reading method (self-boosting) according to the second embodiment of the application. FIG. 6A shows operations of the self-boosting reading method performed on a selected page according to the second embodiment of the application. FIG. 6B shows operations of the self-boosting reading method performed on an unselected page according to the second embodiment of the application.

Reading the odd bit lines of the selected page is taken an example. As shown in FIG. 6A, in the selected page, all the odd bit lines BL1, BL3, . . . are applied by the bit line voltage VBL and all the even bit lines BL2, BL4, . . . are applied by the voltage Vcc. The string select line SSL is applied by the voltage Vpass or Vcc to turn on the transistors T01-T04. Reading the transistors on the word line WL3 is taken as an example but the application is not limited by. The word line WL3 is applied by the read voltage Vread to turn on the transistors T31-T34 coupled to the word line WL3. Other word lines are applied by the pass voltage Vpass to turn on the coupled transistors. The odd ground select line GSL_odd, coupled to the read odd bit lines, is applied by the voltage Vpass or Vcc to turn on the coupled transistors TG1, TG3, . . . . The even ground select line GSL_even, coupled to the unread even bit lines, is applied by the voltage VGSL to turn off the coupled transistors TG2, TG4, . . . . The common source line CSL is applied by 0V.

In the second reading method (self-boosting) of the second embodiment of the application, via the voltage applying, the gate-source voltage of the unread/unselected transistors may be reduced to reduce the read disturbance error. For example, as shown in FIG. 6A, if the odd bit lines of the selected page are read, the gate-source voltages of the transistors of the even bit lines (for example, the transistor T32 on the bit line BL2) are Vpass-VBL because of self-boosting. That is because the transistors T12-TN2, T14-TN4, . . . are floated and thus the source voltages of the floated transistors T12-TN2, T14-TN4, . . . are self-boosted to VBL.

On the contrary, in the current solution, if the odd bit lines of the selected page are read, the gate-source voltages of the transistors of the even bit lines (for example, the transistor T32 on the bit line BL2) will be Vpass-0V. Therefore, in the second embodiment of the application, the gate-source voltages of the transistors of the unread bit lines in the selected pages are reduced and thus the read disturbance error is reduced.

The gate-source voltage of the transistors of the odd bit lines of the selected page is Vpass-0V or Vread-0V.

Similarly, in the unselected page, as shown in FIG. 6B, the string select line SSL is applied by the voltage Vunssl to turn off the transistors T01'-T04'. The voltages applied to the bit lines BL1'-BL4' and the word lines WL1-WLN of the unselected page are the same or similar to those applied to the bit lines BL1-BL4 and the word lines WL1-WLN of the selected page, and thus the details are omitted here. The odd ground select line GSL_odd coupled to the read odd bit lines is applied by the voltage Vpass or Vcc to turn on the coupled transistors TG1, TG3, . . . . The even ground select line GSL_even coupled to the unread odd bit lines is applied by the voltage VGSL to turn off the coupled transistors TG2, TG4, . . . . The common source line CSL is applied by 0V.

Similarly, in the unselected page of FIG. 6B, the turned-on transistors on the even bit lines of the unselected page are self-boosted, as described above. The gate-source voltages of the turned-on transistors on the even bit lines of the unselected page are reduced as Vpass-Vch, and thus the read disturbance error is also reduced. The gate-source voltages of the transistors on the odd bit lines of the unselected pages are Vpass-0V.

In the second embodiment of the application, how to apply voltages to the odd ground select line GSL_odd and to the even ground select line GSL_even based on the selection of the string select line SSL and the bit lines is shown in the following table 1.

TABLE 1

| Selection of SSL | SSL0 is selected | SSL1 is selected |
| --- | --- | --- |

TABLE 1-continued

| Selection of BL | Odd bit lines | Even bit lines | Odd bit lines | Even bit lines |
|---|---|---|---|---|
| Voltages applied on GSL | GSL_odd: Vcc; GSL_even: VGSL | GSL_odd: VGSL; GSL_even: Vcc | GSL_odd: VGSL; GSL_even: Vcc | GSL_odd: Vcc; GSL_even: VGSL |

In the above table 1, if the pages related to the string select line SSL0 is to be read, (1) in reading the odd bit lines, the voltage applied to the odd ground select line GSL_odd is Vcc while the voltage applied to the even ground select line GSL_even is VGSL; and (2) in reading the even bit lines, the voltage applied to the odd ground select line GSL_odd is VGSL while the voltage applied to the even ground select line GSL_even is Vcc.

Similarly, if the pages related to the string select line SSL1 is to be read, (1) in reading the odd bit lines, the voltage applied to the odd ground select line GSL_odd is VGSL while the voltage applied to the even ground select line GSL_even is Vcc; and (2) in reading the even bit lines, the voltage applied to the odd ground select line GSL_odd is Vcc while the voltage applied to the even ground select line GSL_even is VGSL.

In reading pages related to SSL2, SSL4, SSL6, . . . , the voltage application is the same or similar to that in reading pages related SSL0. In reading pages related to SSL3, SSL5, SSL7, . . . , the voltage application is the same or similar to that in reading pages related SSL1.

Thus, in the above two embodiments of the application, no matter to read the memory cells by the self-biasing or by the self-boosting, the gate-source voltages of the unread/unselected transistors are effectively reduced and thus the read disturbance error is effectively reduced.

Besides, as for pre-charging, in the above embodiments of the application, if the odd bit lines and the even bit lines are applied by the same voltage, the coupling capacitance is effectively reduced. Thus, the pre-charging efficiency, the sensed noise and the current consumption are improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device including:
   a plurality of conductive stack structures, including at least a string select line, a plurality of word lines, at least an odd ground select line and at least an even ground select line;
   a plurality of memory cells, formed in the conductive stack structures;
   a plurality of bit lines, formed on the conductive stack structures; and
   at least a common source line, formed on the conductive stack structures,
   wherein the odd ground select line is coupled to a plurality of odd bit lines of the bit lines, and the even ground select line is coupled to a plurality of even bit lines of the bit lines.

2. The memory device according to claim 1, wherein
   a string current from any odd bit line of the odd bit lines flow through a corresponding conductive stack structure of the conductive stack structures into the common source line; and
   another string current from any even bit line of the even bit lines flow through another corresponding conductive stack structure of the conductive stack structures into the common source line.

3. The memory device according to claim 1, wherein
   the string select line and a first word line group of the word lines are stacked as a first conductive stack structure of the conductive stack structures; and
   the ground select line and a second word line group of the word lines are stacked as a second conductive stack structure of the conductive stack structures.

4. The memory device according to claim 1, wherein
   the memory cells are formed on a plurality of sidewalls of the conductive stack structures; and
   the odd ground select line is electrically isolated from the even ground select line.

* * * * *